(12) United States Patent
Okura et al.

(10) Patent No.: US 9,258,507 B2
(45) Date of Patent: Feb. 9, 2016

(54) SOLID-STATE IMAGING APPARATUS

(71) Applicant: RENESAS ELECTRONICS CORPORATION, Kawasaki-shi, Kanagawa (JP)

(72) Inventors: Shunsuke Okura, Kanagawa (JP); Koji Shida, Kanagawa (JP); Hiroshi Kato, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/588,787

(22) Filed: Jan. 2, 2015

(65) Prior Publication Data
US 2015/0115135 A1    Apr. 30, 2015

Related U.S. Application Data

(63) Continuation of application No. 13/870,893, filed on Apr. 25, 2013, now Pat. No. 8,941,045.

(30) Foreign Application Priority Data

Apr. 25, 2012 (JP) ................................. 2012-099613

(51) Int. Cl.
H04N 5/378 (2011.01)
H03M 1/00 (2006.01)
(52) U.S. Cl.
CPC .................. *H04N 5/378* (2013.01); *H03M 1/00* (2013.01)
(58) Field of Classification Search
CPC .................................. H04N 5/378; H03M 1/00
USPC ........ 250/208.1, 214 R, 214.1; 348/297–302, 348/308
See application file for complete search history.

(56) References Cited

U.S. PATENT DOCUMENTS 5,181,231 A * 1/1993 Parikh .................. H03K 21/403
377/24.1
5,263,056 A * 11/1993 Urbansky .............. H04J 3/0623
370/505

(Continued)

FOREIGN PATENT DOCUMENTS

JP    2000-287137 A    10/2000
JP    2003-513582 A     4/2003

(Continued)

OTHER PUBLICATIONS

Notice of Allowance U.S. Appl. No. 13/870,893 dated Sep. 17, 2014.
Notification of Reasons for Refusal Japanese Patent Application No. 2012-099613 dated Sep. 1, 2015 with full English translation.

(Continued)

*Primary Examiner* — Seung C Sohn
(74) *Attorney, Agent, or Firm* — McDermott Will & Emery LLP

(57) ABSTRACT

There is a need to provide a solid-state imaging apparatus capable of highly accurately analog-to-digital converting an analog voltage output from a pixel circuit. The solid-state imaging apparatus supplies a counter code to an integral A/D converter. The counter code CD includes 3-phase clock signals and gray signals. The clock signals each have a cycle equal to specified cycle multiplied by 8 and allow phases to shift from each other by specified cycle. The gray signals linearly increase count values at a cycle equal to specified cycle multiplied by 4. The counter code reverses only the logical level of a signal when a count value changes. A count value error can be limited to a minimum.

4 Claims, 17 Drawing Sheets

(56) References Cited

U.S. PATENT DOCUMENTS

| | | | |
|---|---|---|---|
| 5,754,614 A * | 5/1998 | Wingen | H03K 23/005 341/97 |
| 6,314,154 B1 | 11/2001 | Pontius | |
| 7,623,173 B2 | 11/2009 | Nitta et al. | |
| 7,671,317 B2 | 3/2010 | Shimomura et al. | |
| 8,039,781 B2 | 10/2011 | Shimomura et al. | |
| 2010/0110252 A1 | 5/2010 | Shimomura et al. | |

FOREIGN PATENT DOCUMENTS

| | | |
|---|---|---|
| JP | 2005-278135 A | 10/2005 |
| JP | 2008-092091 A | 4/2008 |
| JP | 2009-33297 A | 2/2009 |

* cited by examiner

FIG. 9

| VALUE | g4 | g3 | g2 | CLKB | CLKC | CLKD |
|---|---|---|---|---|---|---|
| 0 | 0 | 0 | 0 | 0 | 0 | 0 |
| 1 | 0 | 0 | 0 | 1 | 0 | 0 |
| 2 | 0 | 0 | 0 | 1 | 1 | 0 |
| 3 | 0 | 0 | 0 | 1 | 1 | 1 |
| 4 | 0 | 0 | 1 | 1 | 1 | 1 |
| 5 | 0 | 0 | 1 | 0 | 1 | 1 |
| 6 | 0 | 0 | 1 | 0 | 0 | 1 |
| 7 | 0 | 0 | 1 | 0 | 0 | 0 |
| 8 | 0 | 1 | 1 | 0 | 0 | 0 |
| 9 | 0 | 1 | 1 | 1 | 0 | 0 |
| 10 | 0 | 1 | 1 | 1 | 1 | 0 |
| 11 | 0 | 1 | 1 | 1 | 1 | 1 |
| 12 | 0 | 1 | 0 | 1 | 1 | 1 |
| 13 | 0 | 1 | 0 | 0 | 1 | 1 |
| 14 | 0 | 1 | 0 | 0 | 0 | 1 |
| 15 | 0 | 1 | 0 | 0 | 0 | 0 |
| 16 | 1 | 1 | 0 | 0 | 0 | 0 |
| 17 | 1 | 1 | 0 | 1 | 0 | 0 |
| 18 | 1 | 1 | 0 | 1 | 1 | 0 |
| 19 | 1 | 1 | 0 | 1 | 1 | 1 |
| 20 | 1 | 1 | 1 | 1 | 1 | 1 |
| 21 | 1 | 1 | 1 | 0 | 1 | 1 |
| 22 | 1 | 1 | 1 | 0 | 0 | 1 |
| 23 | 1 | 1 | 1 | 0 | 0 | 0 |
| 24 | 1 | 0 | 1 | 0 | 0 | 0 |
| 25 | 1 | 0 | 1 | 1 | 0 | 0 |
| 26 | 1 | 0 | 1 | 1 | 1 | 0 |
| 27 | 1 | 0 | 1 | 1 | 1 | 1 |
| 28 | 1 | 0 | 0 | 1 | 1 | 1 |
| 29 | 1 | 0 | 0 | 0 | 1 | 1 |
| 30 | 1 | 0 | 0 | 0 | 0 | 1 |
| 31 | 1 | 0 | 0 | 0 | 0 | 0 |

SOLID-STATE IMAGING APPARATUS

CROSS-REFERENCE TO RELATED APPLICATIONS

The subject application is a Continuation of U.S. Ser. No. 13/870,893 filed Apr. 25, 2013 which claims priority to Japanese Patent Application No. 2012-099613 filed on Apr. 25, 2012. The subject matter of each is incorporated herein by reference in entirety.

BACKGROUND

The present invention relates to a solid-state imaging apparatus. For example, the invention is appropriately applicable to a solid-state imaging apparatus having an integral analog/digital (A/D) converter.

A solid-state imaging apparatus of the related art includes multiple pixel circuits provided for multiple rows and columns, a reference voltage generation circuit, a counter, and an integral A/D converter provided for each column. The pixel circuit outputs an analog voltage whose level corresponds to an incident light quantity. The reference voltage generation circuit generates a reference voltage whose linearly value linearly varies with a temporal change. The counter generates a counter code that linearly varies a count value with a temporal change at a specified cycle. The integral A/D converter latches a counter code in response to reversal of the high-low relationship of an analog voltage from the pixel circuit provided for a column corresponding to the reference voltage. The integral A/D converter outputs the latched counter code as a digital signal (e.g., refer to patent literature 1).

Each column may be provided with an up/down counter to calculate a difference between an analog voltage for imaging and an analog voltage for resetting (e.g., refer to patent literature 2).

The counter code may contain a low-order bit code and a high-order bit code. The low-order bit code includes multiple clock signals that differ from each other in phases. The high-order bit code includes a binary code whose count value varies synchronously with a clock signal. This solid-state imaging apparatus can improve the resolution without increasing a clock signal frequency (e.g., refer to patent literature 3).

Patent literature 4 describes a gray code counter that generates a gray code. The gray code changes only the logical level of a 1-bit signal during an increment (+1).

CITATION LIST

Patent Literature

Patent Literature 1: Japanese Unexamined Patent Publication No. 2000-287137
Patent Literature 2: Japanese Unexamined Patent Publication No. 2005-278135
Patent Literature 3: Japanese Unexamined Patent Publication No. 2008-92091
Patent Literature 4: Japanese Unexamined Patent Application Publication (Translation of PCT Application) No. 2003-513582

SUMMARY

According to patent literature 3, incrementing the counter code changes the logical level of a multi-bit signal. If the clock signal causes significant skew, the count value causes a large error to degrade the A/D conversion accuracy.

These and other objects and novel features of the invention may be readily ascertained by referring to the following description and appended drawings.

According to an embodiment, the solid-state imaging apparatus described in the application uses a counter code including a low-order bit code and a high-order bit code. The low-order bit code includes multiple clock signals whose phases shift from each other by a predetermined cycle. The high-order bit code includes a gray code whose count value varies at a cycle equal to a predetermined cycle multiplied by two or more.

According to an embodiment, incrementing the counter code changes only the logical level of a 1-bit signal Even if the clock signal causes significant skew, a count value error can be limited to a minimum and highly accurate analog-to-digital conversion is available.

BRIEF DESCRIPTION OF THE DRAWINGS

FIG. 9 is a truth table showing relationship between the counter code illustrated in FIG. 8 and count values.

DETAILED DESCRIPTION

First Embodiment

Figure 1:
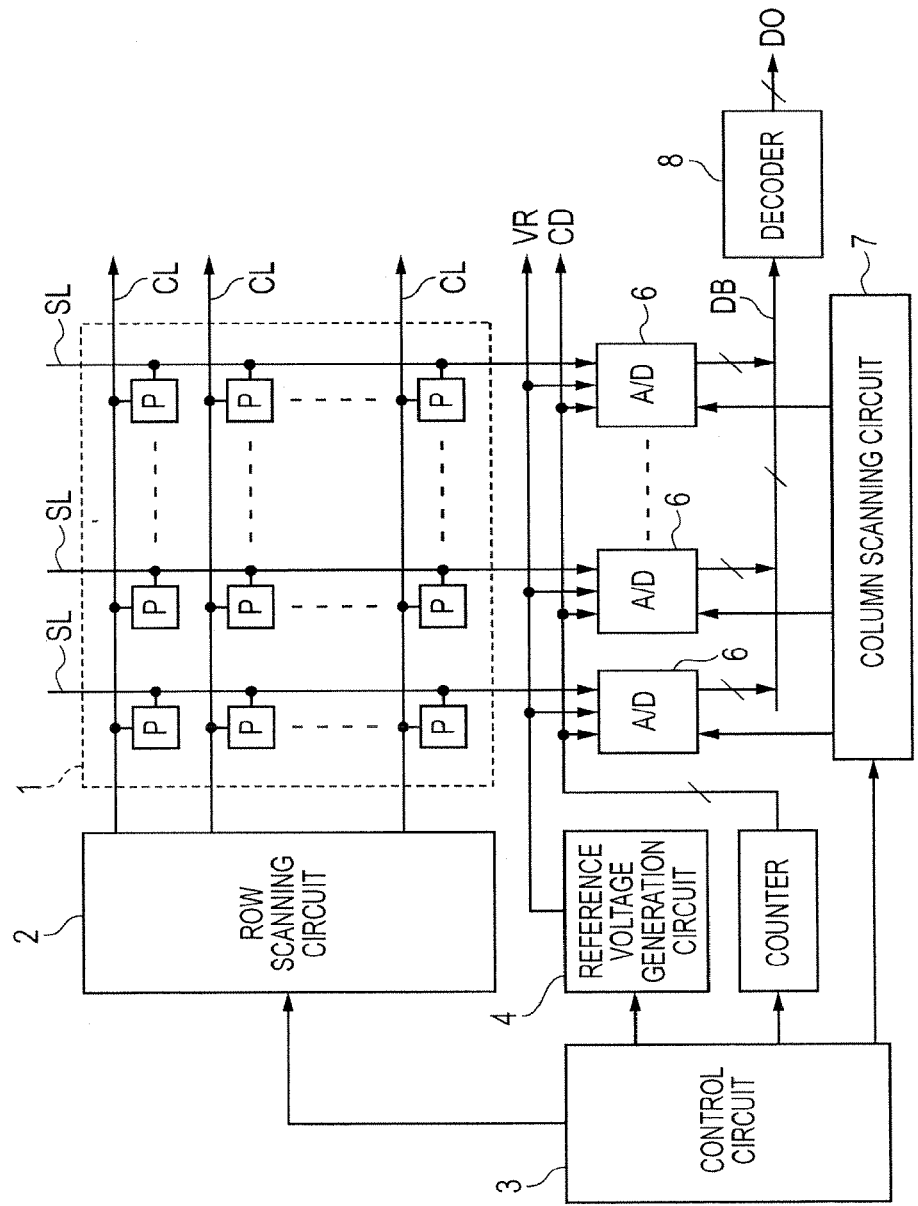
FIG. 1 is a block diagram illustrating a configuration of a solid-state imaging apparatus according to a first embodiment of the application.

As illustrated in FIG. 1, the solid-state imaging apparatus according to the first embodiment of the application includes a pixel array 1, a row scanning circuit 2, and a control circuit 3. The pixel array 1 includes multiple pixel circuit P provided for rows and columns, multiple control lines CL provided for the corresponding rows, and multiple signal lines SL provided for the corresponding columns. Each pixel circuit P outputs analog voltage VA whose level corresponds to an incident light quantity. Each pixel circuit P is coupled to the control line CL for the corresponding row and the signal line SL for the corresponding column. The control lines CL are coupled to the row scanning circuit 2.

Under control of the control circuit 3, the row scanning circuit 2 successively selects rows one by one and activates the level of the control line CL corresponding to the selected row. Each pixel circuit P is activated when the level of the corresponding control line CL is activated. The activated pixel circuit P outputs an analog voltage VA to the corresponding signal line SL while the level of the analog voltage VA corresponds to the incident light quantity. The control circuit 3 controls the entire solid-state imaging device.

The solid-state imaging device includes a reference voltage generation circuit 4, a counter 5, multiple integral A/D converters 6, a data bus DB, a column scanning circuit 7, and a decoder 8. The reference voltage generation circuit 4 generates ramp-waveform reference voltage VR whose voltage value linearly varies with a lapse of time. The counter 5 generates counter code CD whose count value linearly varies with a lapse of time at specified cycle T1. Reference voltage VR and counter code CD are supplied to each of the integral A/D converters 6. The integral A/D converters 6 are coupled to the signal lines SL.

Analog voltage VA is output to the corresponding signal line from pixel circuit P activated by the row scanning circuit 2. Each integral A/D converter 6 converts analog voltage VA into a digital signal based on reference voltage VR and counter code CD.

The column scanning circuit 7 successively selects columns one by one and supplies an output-enabling signal to the integral A/D converter 6 corresponding to the selected column. Each integral A/D converter 6 supplies a digital signal to the decoder 8 in response to the output-enabling signal via the data bus DB. The decoder 8 converts a digital signal from each integral A/D converter 6 into binary code D0 and outputs it to the outside.

Figure 2:
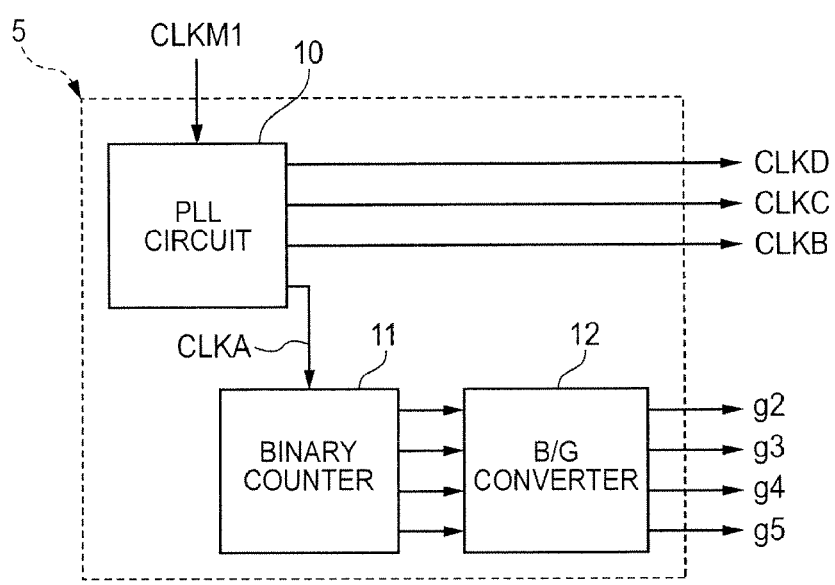
FIG. 2 is a block diagram illustrating a configuration of the counter illustrated in FIG. 1.

FIG. 2 is a block diagram illustrating a configuration of the counter 5. In FIG. 2, the counter 5 includes a phase locked loop (PLL) circuit 10, a binary counter 11, and a binary/gray (B/G) converter 12. The PLL circuit 10 synchronizes with main clock signal CLKM1 to generate multiple phases (four phases in FIG. 2) of clock signals CLKA through CLKD.

Figure 3:
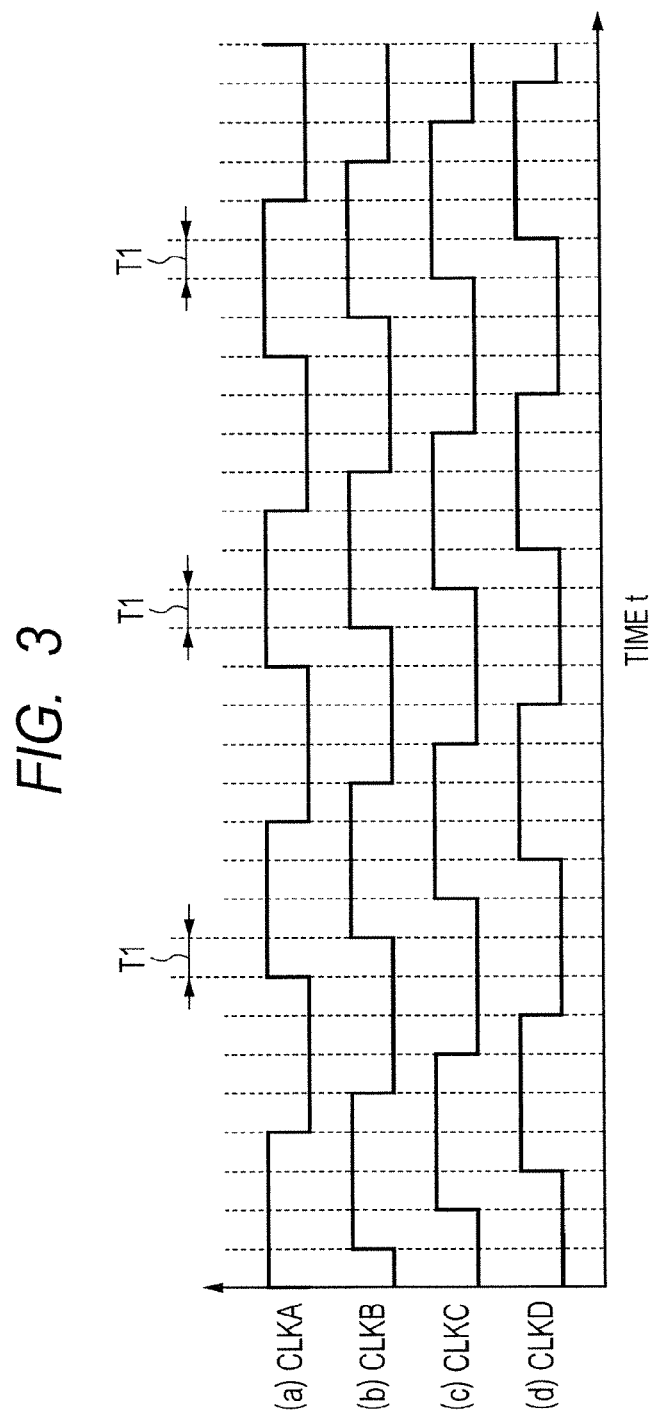
FIG. 3 is a timing chart illustrating operation of the PLL circuit illustrated in FIG. 2.

As described above, a count value of counter code linearly varies at specified cycle T1. The main clock signal CLKM1 has cycle 8×T1 that results from multiplying the specified cycle by eight. As illustrated in FIG. 3, clock signals CLKA through CLKD each have cycle 8×T1 equal to main clock signal CLKM1. Clock signals CLKA through CLKD shift from each other by specified cycle T1. Clock signals CLKB through CLKD are supplied as low-order bit codes in counter code CD to the A/D converters 6. Clock signal CLKA is supplied to the binary counter 11.

Figure 4:
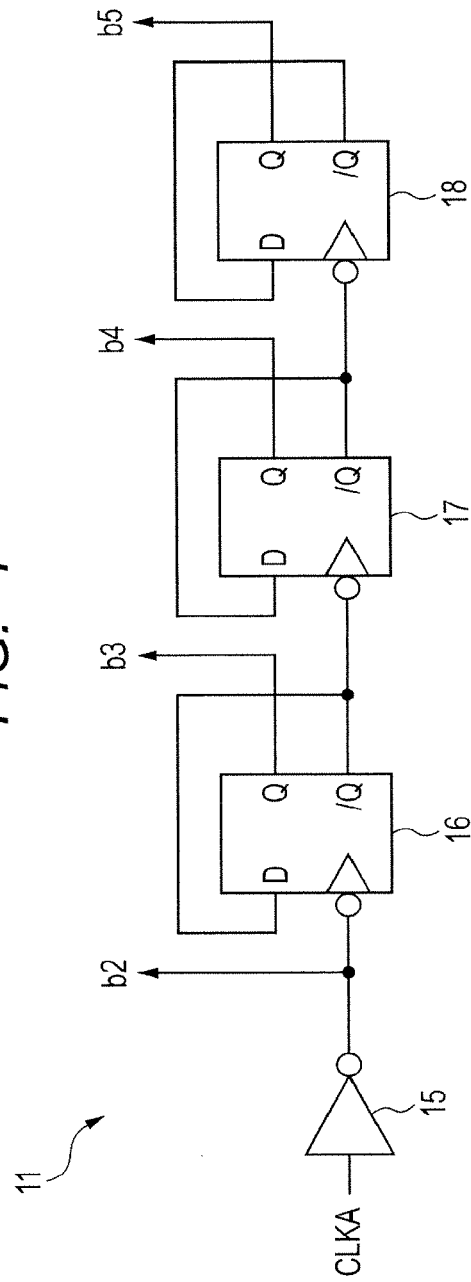
FIG. 4 is a circuit diagram illustrating a configuration of the binary counter illustrated in FIG. 2.
Figure 5:
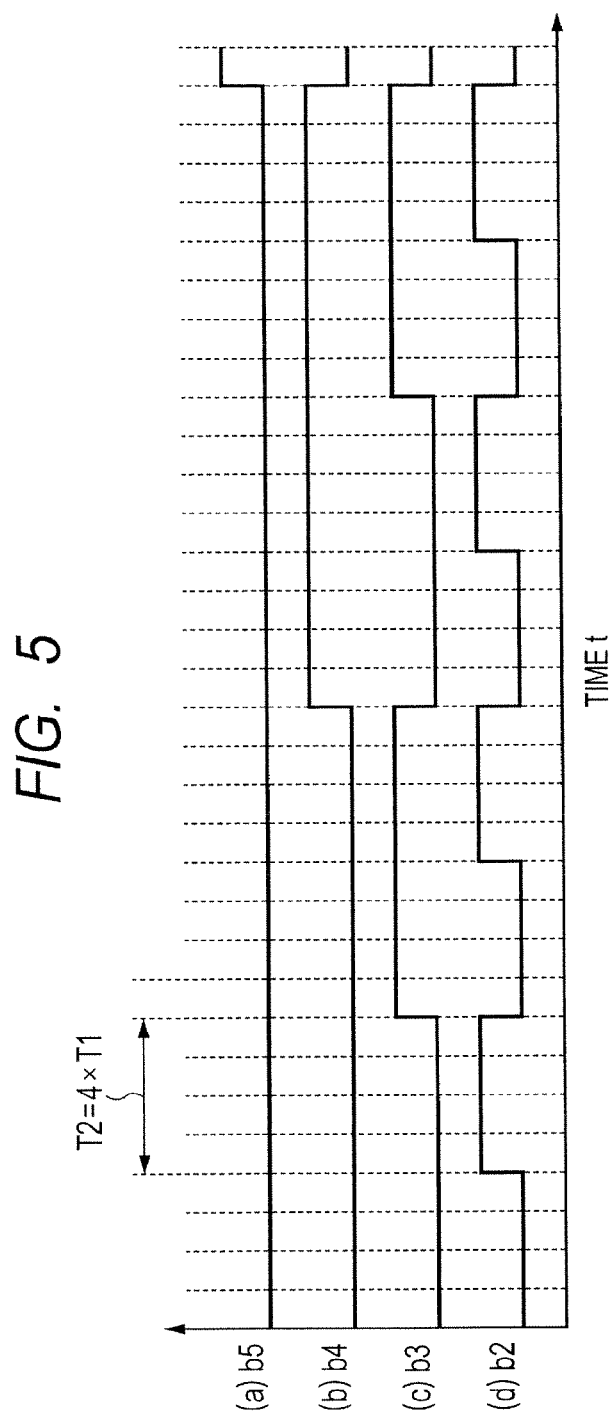
FIG. 5 is a timing chart illustrating operation of the binary counter illustrated in FIG. 4.

FIG. 4 is a circuit diagram illustrating a configuration of the binary counter 11. FIG. 5 is a timing chart illustrating operation of the binary counter 11. In FIGS. 4 and 5, the binary counter 11 includes an inverter 15 and flip-flops 16 through 18. The inverter 15 inverts clock signal CLKA to generate binary signal b2. Inverted output terminals (/Q) of the flip-flops 16 through 18 are coupled to output terminals (D) of the flip-flops 16 through 18, respectively. Inverted output terminals (/Q) of the flip-flops 16 and 17 are coupled to clock terminals of the flip-flops 17 and 18, respectively. The flip-flops 16 through 18 output binary signals b2 through b5, respectively.

Binary signal b2 equals a reversal of clock signal CLKA. The logical level of the binary signal b3 reverses in response to a rising edge of binary signal b2. The logical level of the binary signal b4 reverses in response to a falling edge of binary signal b3. The logical level of the binary signal b5 reverses in response to a falling edge of binary signal b4. A binary code count value includes binary signals b2 through b5 and is incremented by 1 each time the logical level of binary signal b2 reverses at specified cycle T2=4×T1.

Figure 6:
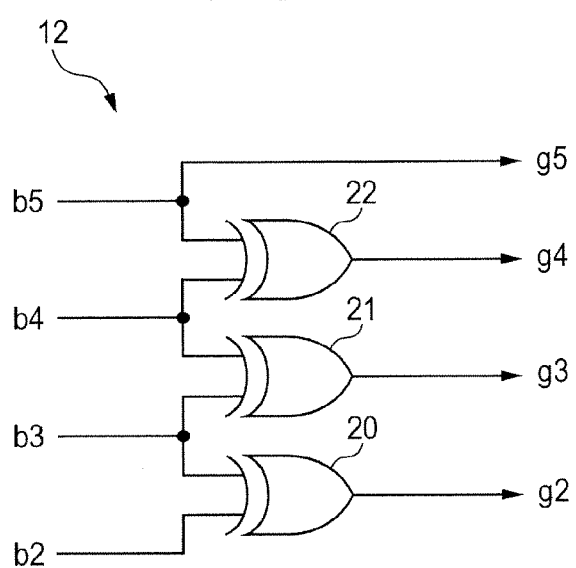
FIG. 6 is a circuit diagram illustrating a configuration of the B/G converter illustrated in FIG. 2.
Figure 7:
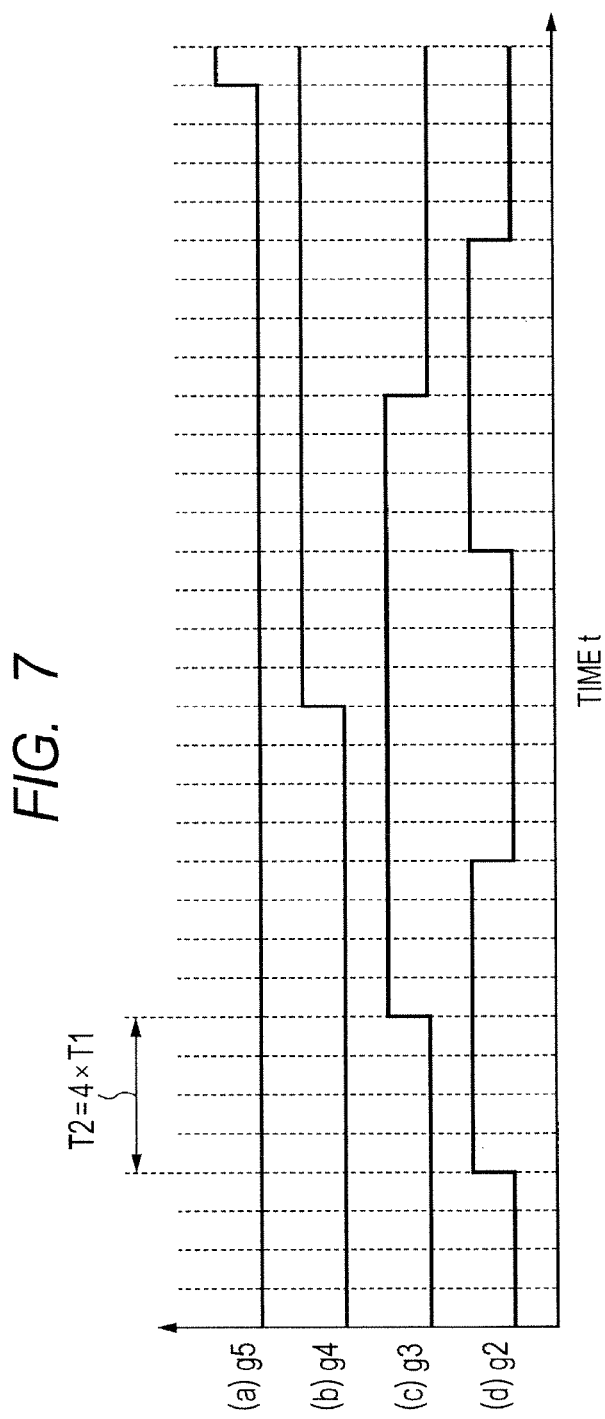
FIG. 7 is a timing chart illustrating operation of the B/G converter illustrated in FIG. 6.

FIG. 6 is a circuit diagram illustrating a configuration of the B/G converter 12. FIG. 7 is a timing chart illustrating operation of the B/G converter 12. In FIGS. 6 and 7, the B/G converter 12 includes EX-OR gates 20 through 22. The EX-OR gate 20 receives binary signals b2 and b3 and outputs gray signal g2. The EX-OR gate 21 receives binary signals b3 and b4 and outputs gray signal g3. The EX-OR gate 22 receives binary signals b4 and b5 and outputs gray signal g4. Binary signal b5 equals gray signal g5.

Gray signal g2 goes to the L level while the logical levels of binary signals b2 and b3 match. Gray signal g2 goes to the H level while the logical levels of binary signals b2 and b3 differ. Gray signal g3 goes to the L level while the logical levels of binary signals b3 and b4 match. Gray signal g3 goes to the H level while the logical levels of binary signals b3 and b4 differ. Gray signal g4 goes to the L level while the logical levels of binary signals b4 and b5 match. Gray signal g4 goes to the H level while the logical levels of binary signals b4 and b5 differ. Binary signal b5 equals gray signal g5.

A gray code count value includes gray signals g2 through g5 and is incremented by 1 at specified cycle T2=4×T1. Incrementing the gray code count value reverses only the logical level of one of gray signals g2 through g5. The gray codes are supplied as high-order bit codes in counter code CD to the A/D converters 6.

Figure 8:
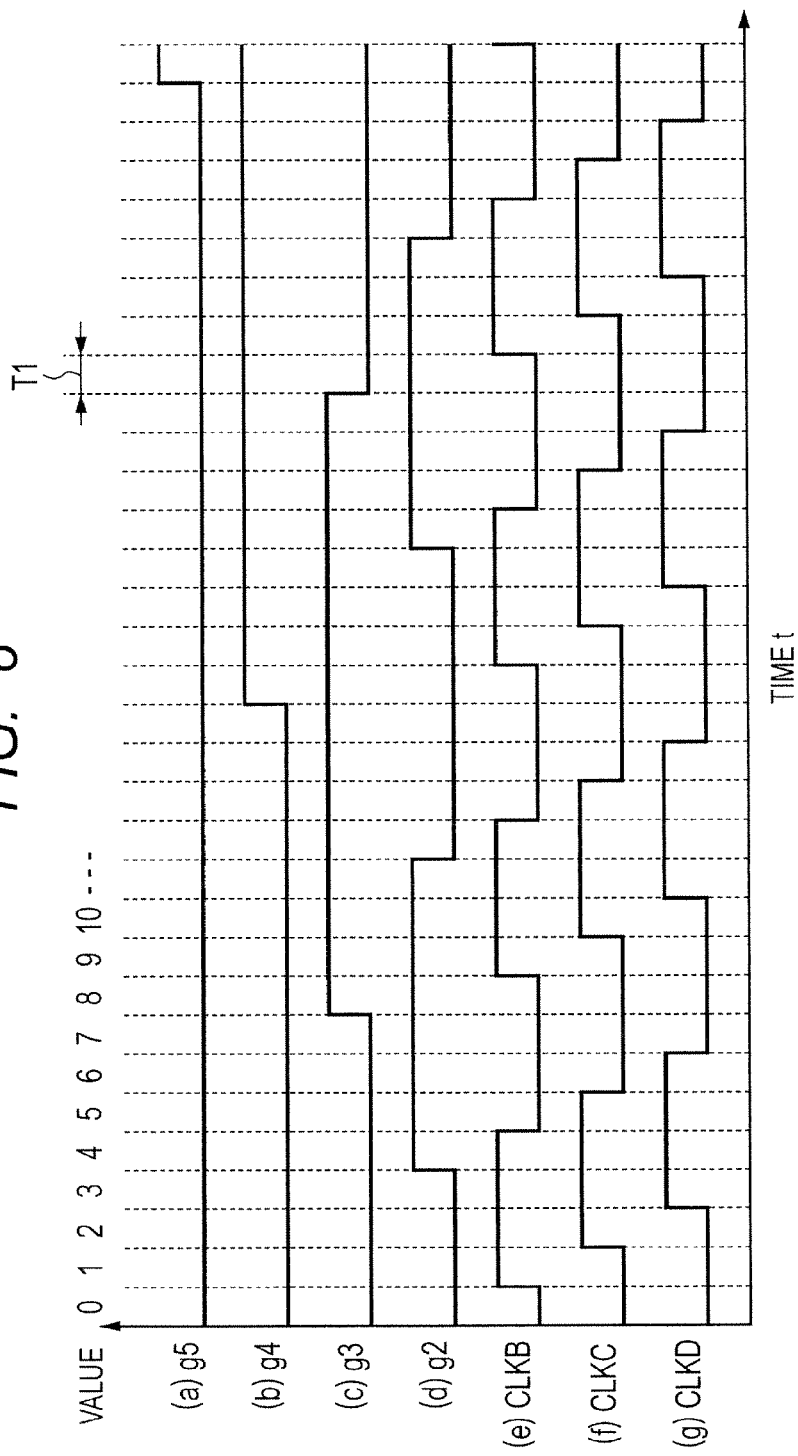
FIG. 8 is a timing chart illustrating temporal changes of the counter code illustrated in FIG. 2.

FIG. 8 is a timing chart illustrating temporal changes of counter code CD illustrated in FIG. 2. FIG. 9 is a truth table showing relationship between counter code CD and count values. In FIGS. 8 and 9, counter code CD includes a low-order bit code including three-phase clock signals CLKB through CLKD and a high-order bit code including gray signals g2 through g5. The logical level of clock signals CLKB through CLKD is available in four combinations 111, 011, 001, and 000 and provides 2-bit resolution. The count value of counter code CD is incremented by 1 at specified cycle T1. Counter code CD reverses the only logical level of one signal when the count value changes. Limiting signal skew to T1 or lower can maintain a count value error to be 1 or smaller.

Figure 10:
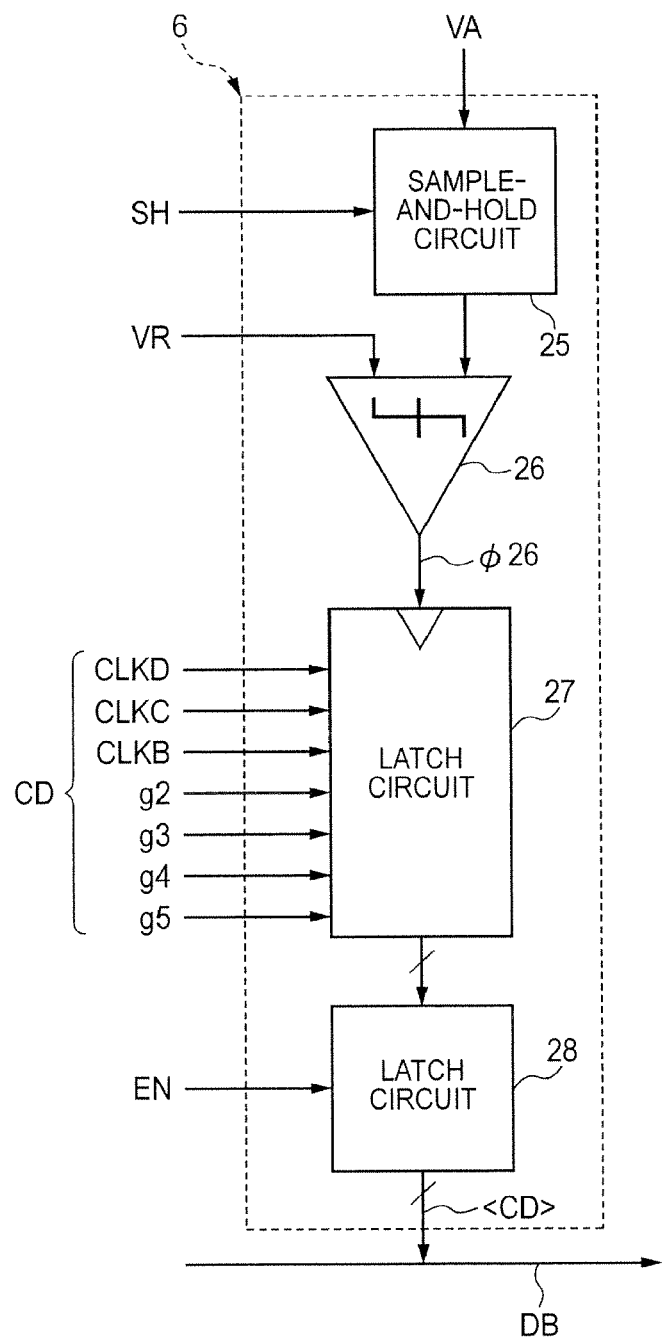
FIG. 10 is a block diagram illustrating a configuration of the integral A/D converter illustrated in FIG. 1.

FIG. 10 is a block diagram illustrating a configuration of the integral A/D converter 6. In FIG. 10, the integral A/D converter 6 includes a sample-and-hold circuit 25, a comparator 26, and latch circuits 27 and 28. The sample-and-hold circuit 25 is supplied with analog voltage VA from pixel circuit P for the selected row via corresponding signal line SL. The sample-and-hold circuit 25 holds and outputs analog voltage VA in response to sample-and-hold enable signal SH from the control circuit 3.

A voltage value of reference voltage VR linearly varies with the time in response to sample-and-hold enable signal SH. The comparator 26 compares analog voltage VA from the sample-and-hold circuit 25 with reference voltage VR from the reference voltage generation circuit 4 in terms of the high or low level and outputs a signal ∅26 indicating a comparison result. The signal ∅ 26 goes to the L level while reference voltage VR is lower than analog voltage VA. The signal ∅ 26 rises from the L level to the H level when reference voltage VR increases to exceed analog voltage VA.

A count value of counter code CD linearly varies with the time in response to sample-and-hold enable signal SH. When the signal ∅ 26 rises from the L level to the H level, the latch circuit 27 holds and outputs counter code CD from the counter 5 as an A/D conversion result. The latch circuit 28 holds the A/D conversion result output from the latch circuit 27 and outputs held A/D conversion result <CD> to the data bus DB in response to output-enabling signal EN from the column scanning circuit 7. The A/D conversion result <CD> contains low-order bit codes <CLKB> through <CLKD> made of clock signals and high-order bit codes <g2> through <g5> made of gray codes. The A/D conversion result <CD> is supplied to the decoder 8 via the data bus DB.

Figure 11:
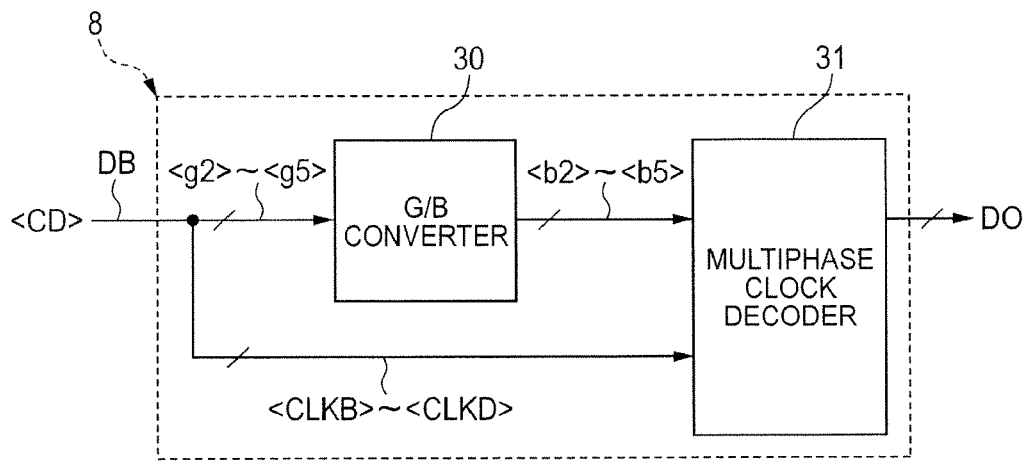
FIG. 11 is a block diagram illustrating a configuration of the decoder illustrated in FIG. 1.
Figure 12:
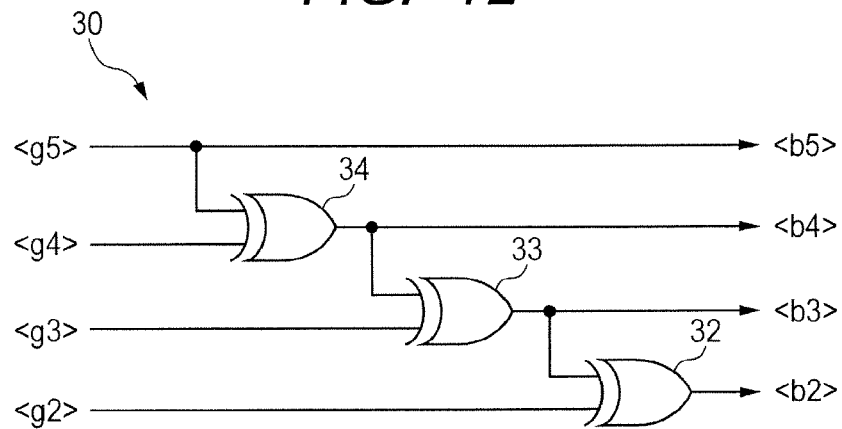
FIG. 12 is a circuit diagram illustrating a configuration of the G/B converter illustrated in FIG. 11.

FIG. 11 is a block diagram illustrating a configuration of the decoder 8. In FIG. 11, the decoder 8 uses a digital signal processor (DSP), for example, and includes a G/B converter 30 and a multiphase clock decoder 31. The G/B converter 30 converts gray signals <g2> through <g5> contained in the A/D conversion result <CD> into binary signals <b2> through <b5>. As illustrated in FIG. 12, the G/B converter 30 contains EX-OR gates 32 through 34.

Gray signal <g5> is converted into binary signal <b5>. The EX-OR gate 34 receives gray signals <g4> and <g5> and outputs binary signal <b4>. The EX-OR gate 33 receives binary signal <b4> and gray signal <g3> and outputs binary signal <b3>. The EX-OR gate 32 receives binary signal <b3> and gray signal <g2> and outputs binary signal <b2>.

Binary signal <b4> goes to the L level while the logical levels of gray signals <g4> and <g5> match. Binary signal <b4> goes to the H level while the logical levels of gray signals <g4> and <g5> differ. Binary signal <b3> goes to the L level while the logical levels of binary signal <b4> and gray signal <g3> match. Binary signal <b3> goes to the H level while the logical levels of binary signal <b4> and gray signal <g3> differ. Binary signal <b2> goes to the L level while the logical levels of binary signal <b3> and gray signal <g2> match. Binary signal <b2> goes to the H level while the logical levels of binary signal <b3> and gray signal <g2> differ.

The multiphase clock decoder 31 decodes clock signals <CLKB> through <CLKD> and binary signal component <b2> contained in A/D conversion result <CD> to generate 2-bit binary signals <b0> and <b1>. The multiphase clock decoder 31 unifies generated binary signals <b0> and <b1> and binary signals <b2> through <b5> from the G/B converter 30 to generate 6-bit binary code D0 and outputs binary code D0 to the outside.

The following describes effects of the first embodiment. Only a binary counter may be used to generate counter code CD whose count value linearly varies at specified cycle T1. In such a case, the clock signal contained in counter code CD uses the highest frequency of 1/(2×T1). A recent trend is to increase the size and precision of the pixel array 1, thus increasing the number of integral A/D converters 6 to be coupled to the counter 5. If the clock signal contained in counter code CD uses a high frequency, it is difficult to supply counter code CD to all integral A/D converters 6.

According to the first embodiment, by contrast, clock signals CLKB through CLKD contained in counter code CD use the highest frequency of 1/(8×T1). Therefore, the first embodiment can decrease frequencies of clock signals contained in counter code CD to be lower than those of the related art. Counter code CD can be easily supplied to all integral A/D converters 6.

If only the binary counter is used to generate counter code CD, a change in the count value of counter code CD simultaneously changes logical levels of multiple clock signals. If the rising or falling edge of the clock signal causes timing skew at this time, the latch circuit 27 in the A/D converter 6 latches counter code CD whose count value contains a large error.

By contrast, according to the first embodiment, a change in the count value of counter code CD changes only the logical level of one signal. Limiting signal skew contained in counter code CD to specified cycle T1 or lower can maintain a count value error to be 1 or smaller. The highly accurate A/D conversion is available.

According to the first embodiment, three clock signals CLKB through CLKD configure the low-order bit code of counter code CD. Four gray signals g2 through g5 configure the high-order bit code. The invention is not limited thereto. Any number of $(2^n-1)$ clock signals CLK may configure the low-order bit code of counter code CD. Any number of gray signals g may configure the high-order bit code.

Comparative Example

Figure 13:
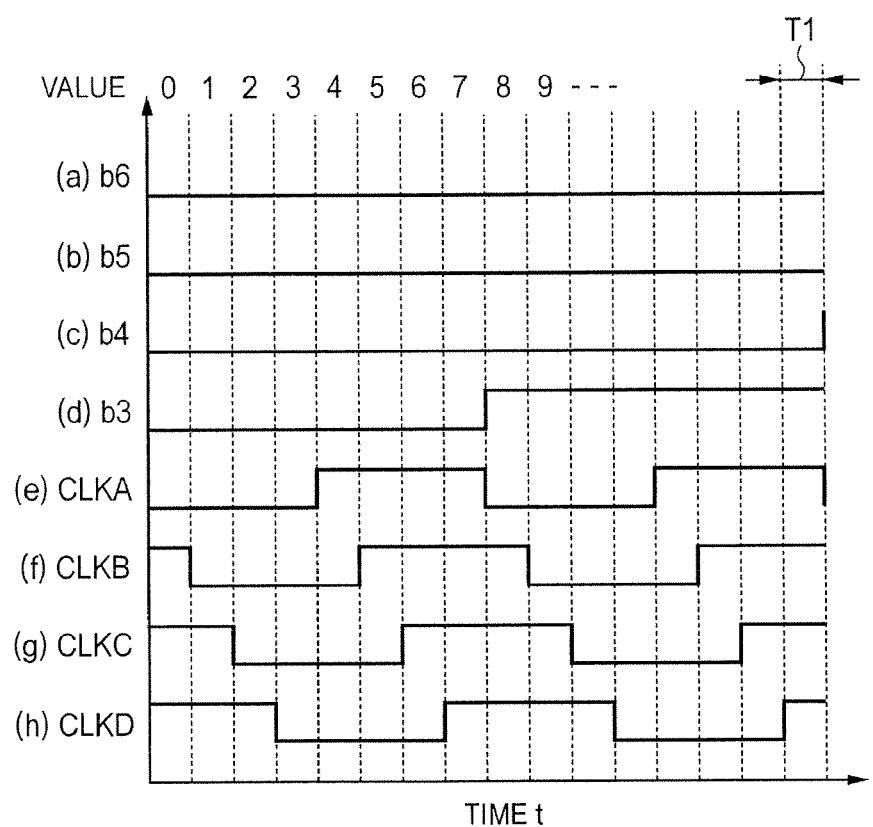
FIG. 13 is a timing chart illustrating a comparative example of the first embodiment.

FIG. 13 is a timing chart illustrating a comparative example of the first embodiment. According to the comparative example in FIG. 13, 4-phase clock signals CLKA through CLKD configure the low-order bit code of counter code CD. A binary code of binary signals b3 through b6 configures the high-order bit code. Clock signals CLKA through CLKD shift from each other by specified cycle T1 and each have the same cycle 8×T1. The logical level of clock signals CLKA through CLKD is available in eight combinations and provides 3-bit resolution. Binary signal b3 rises from the L level to the H level in response to a rising edge of clock signal CLKA. Binary signals b4 through b6 rise from the L level to the H level in response to rising edges of binary signals b3 through b5, respectively. The count value of counter code CD is incremented by 1 at specified cycle T1.

Figure 14:
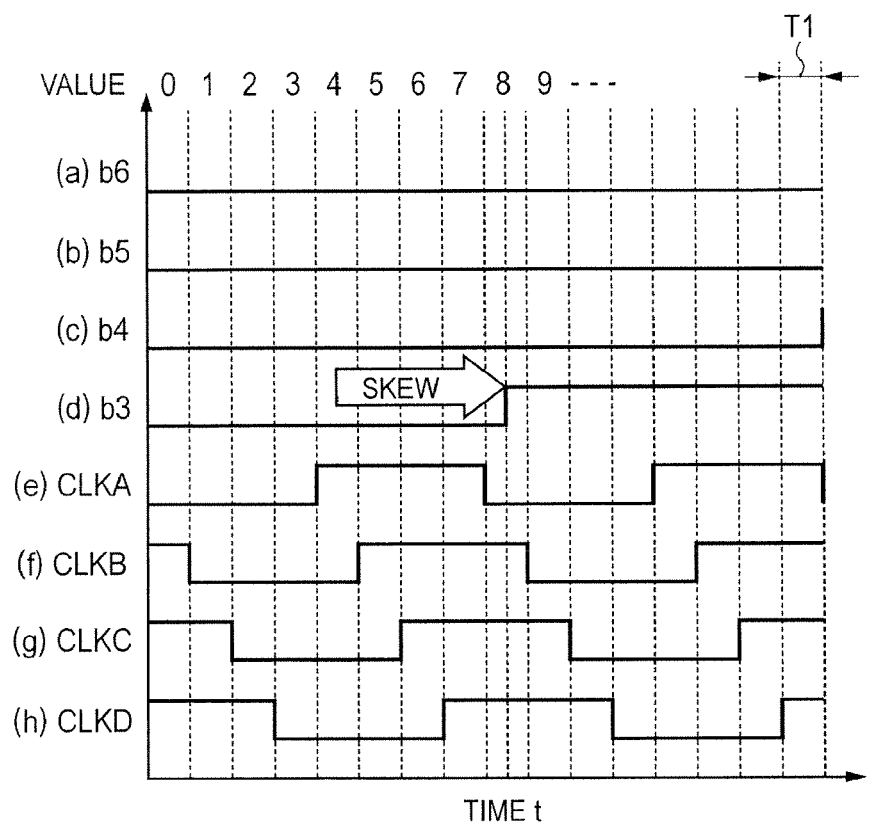
FIG. 14 is a timing chart illustrating the problem of the comparative example described with reference to FIG. 13.

FIG. 14 is a timing chart illustrating the problem of the comparative example. FIG. 14 assumes that the rising edge of binary signal b3 delays approximately a half of specified cycle T1. In this case, the count value is set to 0 if counter code CD is latched before the rising edge of binary signal b3. The count value is set to 8 if counter code CD is latched after the rising edge of binary signal b3. Namely, the count value may cause a large error if the rising edge of binary signal b3 skews.

By contrast, according to the first embodiment as illustrated in FIG. 8, the count value causes just an error of 1 even if the first rising edge of gray signal g3 delays approximately a half of specified cycle T1. The count value is set to 7 if counter code CD is latched before the rising edge of gray signal g3. The count value is set to 8 if counter code CD is latched after the rising edge of gray signal g3. Namely, the count value does not cause a large error even if the rising edge of binary signal b3 skews.

Second Embodiment

Figure 15:
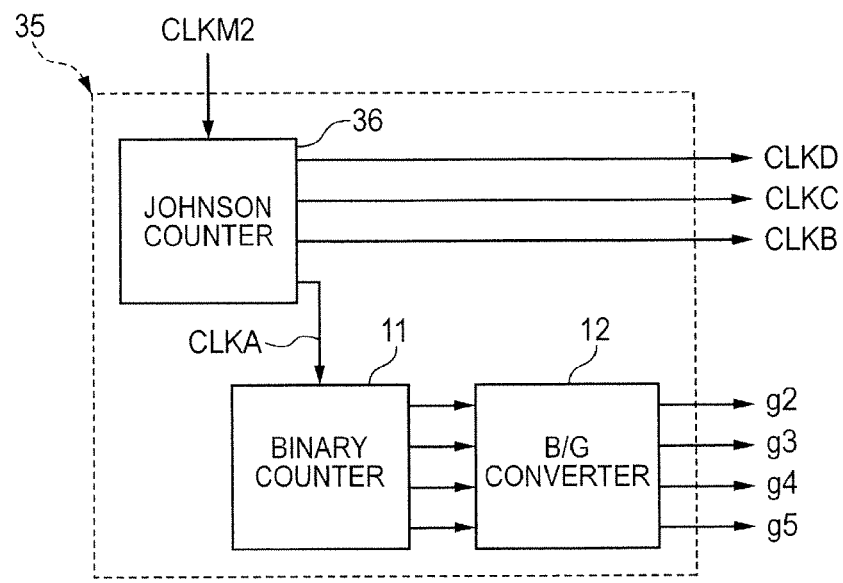
FIG. 15 is a block diagram illustrating a configuration of a counter included in the solid-state imaging apparatus according to a second embodiment of the application.

FIG. 15 is a block diagram illustrating a configuration of a counter 35 included in the solid-state imaging apparatus according to the second embodiment of the application and is compared with FIG. 2. With reference to FIG. 15, the counter 35 differs from the counter 5 in that a Johnson counter 36 replaces the PLL circuit 10. The Johnson counter 36 counts pulses of main clock signal CLKM2 at specified cycle T1 and generates 4-phase clock signals CLKA through CLKD. The other configurations and operations are equal to those of the first embodiment and a description is omitted for simplicity. The second embodiment also provides the same effect as the first embodiment.

The frequency of main clock signal CLKM2 used for the counter 35 is eight times the frequency of main clock signal CLKM1 used for the counter 5 according to the first embodiment. Main clock signal CLKM2 can be easily accelerated because an area of the counter 35 is sufficiently smaller than the A/D converters 6. The Johnson counter 36 is a digital circuit and therefore can be designed more easily than the PLL circuit 10 as an analog circuit.

Third Embodiment

Figure 16:
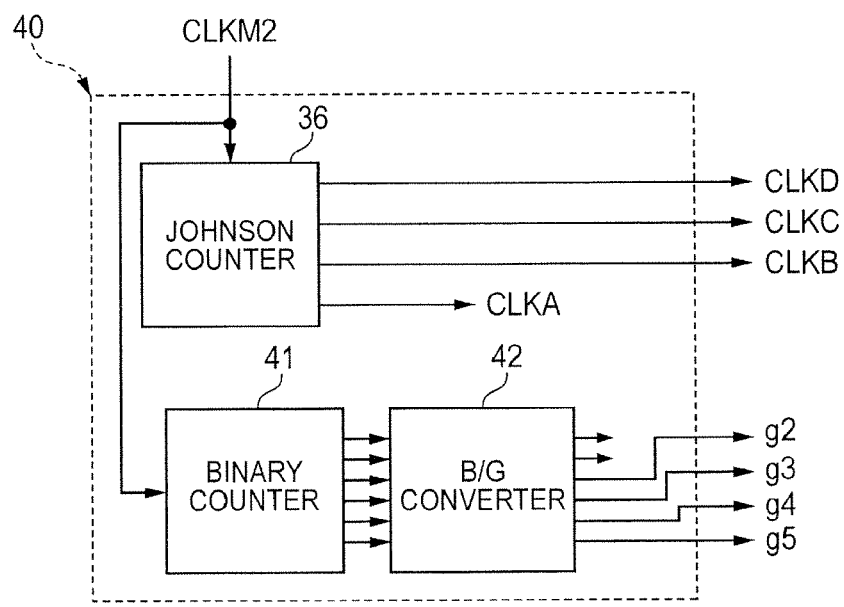
FIG. 16 is a block diagram illustrating a configuration of a counter included in the solid-state imaging apparatus according to a third embodiment of the application.

FIG. 16 is a block diagram illustrating a configuration of a counter 40 included in the solid-state imaging apparatus according to the third embodiment of the application and is compared with FIG. 15. With reference to FIG. 16, the counter 40 differs from the counter 35 in that a binary counter 41 and a B/G converter 42 replace the binary counter 11 and the B/G converter 12, respectively.

The binary counter 41 counts pulses of main clock signal CLKM2 to generate binary signals b0 through b5. The B/G converter 42 converts binary signals b0 through b5 into gray signals g0 through g5. Only gray signals g3 through g5 of gray signals g0 through g5 are output as a high-order bit code for counter code CD. The other configurations and operations are equal to those of the first embodiment and a description is omitted for simplicity. The third embodiment also provides the same effect as the first embodiment.

Fourth Embodiment

Figure 17:
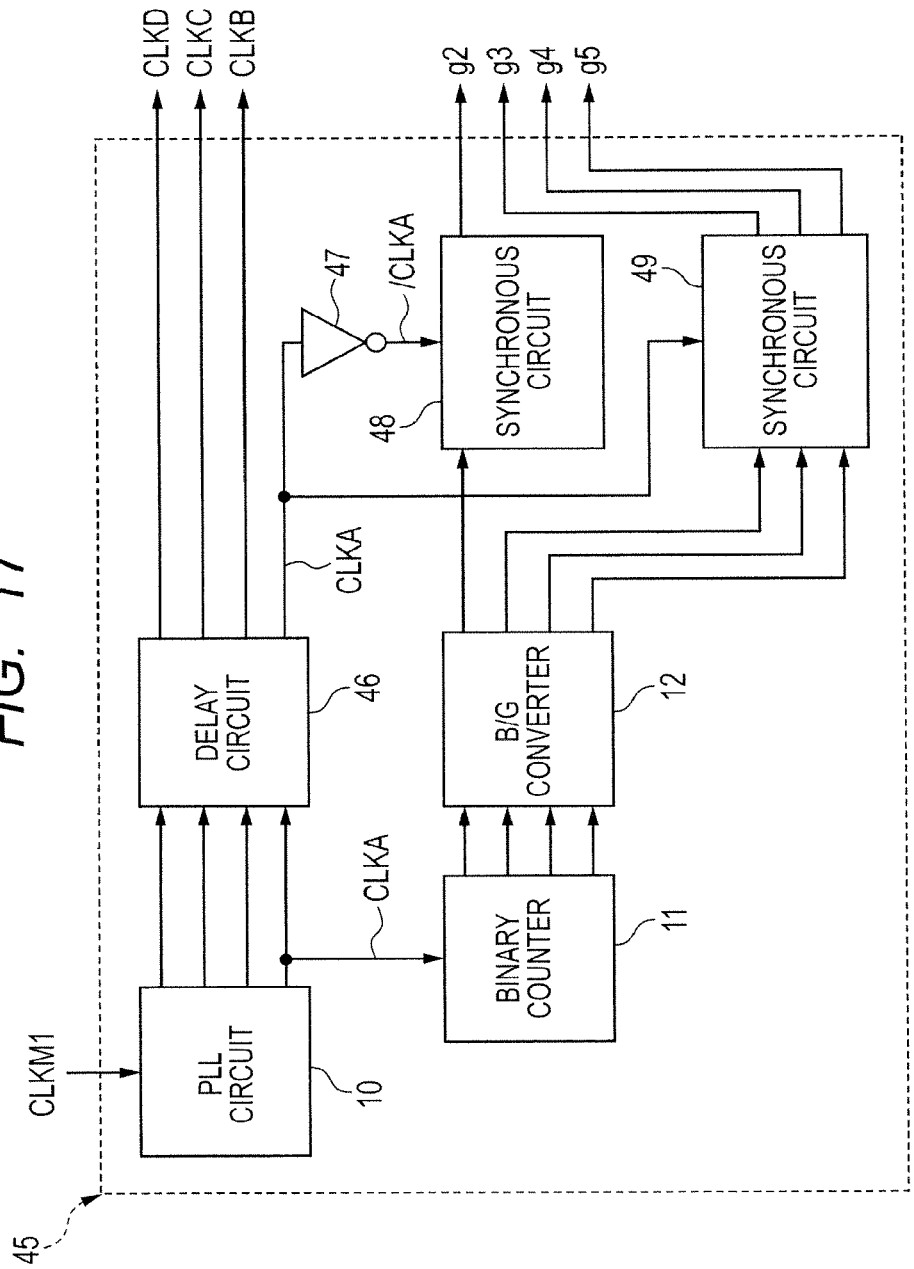
FIG. 17 is a block diagram illustrating a configuration of a counter included in the solid-state imaging apparatus according to a fourth embodiment of the application.

FIG. 17 is a block diagram illustrating a configuration of a counter 45 included in the solid-state imaging apparatus according to the fourth embodiment of the application and is compared with FIG. 2. With reference to FIG. 17, the counter 45 differs from the counter 5 in that a delay circuit 46, an inverter 47, and synchronization circuits 48 and 49 are added.

The delay circuit 46 delays clock signals CLKA through CLKD generated from the PLL circuit 10 by specified time Td. Delay time Td is set to be slightly longer than the total delay time for the binary counter 11 and the B/G converter 12. The inverter 47 supplies the synchronization circuit 48 with /CLKA by reversing clock signal CLKA passing through the delay circuit 46.

The synchronization circuit 48 includes a 1-bit flip-flop operating in synchronization with clock signal /CLKA and receives gray signal g2 generated from the B/G converter 12. While clock signal /CLKA is set to the L level, the synchronization circuit 48 incorporates gray signal g2 and holds and outputs gray signal g2 in response to a rising edge of clock signal /CLKA.

The synchronization circuit 49 includes a 3-bit flip-flop operating in synchronization with clock signal CLKA passing through the delay circuit 46 and receives gray signals g3 through g5 generated from the B/G converter 12. While clock signal CLKA is set to the L level, the synchronization circuit 48 incorporates gray signals g3 through g5 and holds and outputs gray signals g3 through g5 in response to a rising edge of clock signal CLKA.

Clock signals CLKB through CLKD passing through the delay circuit 46 correspond to the low-order bit code for counter code CD. Gray signal g2 through g5 passing through the synchronization circuits 48 and 49 correspond to the high-order bit code.

Figure 18:
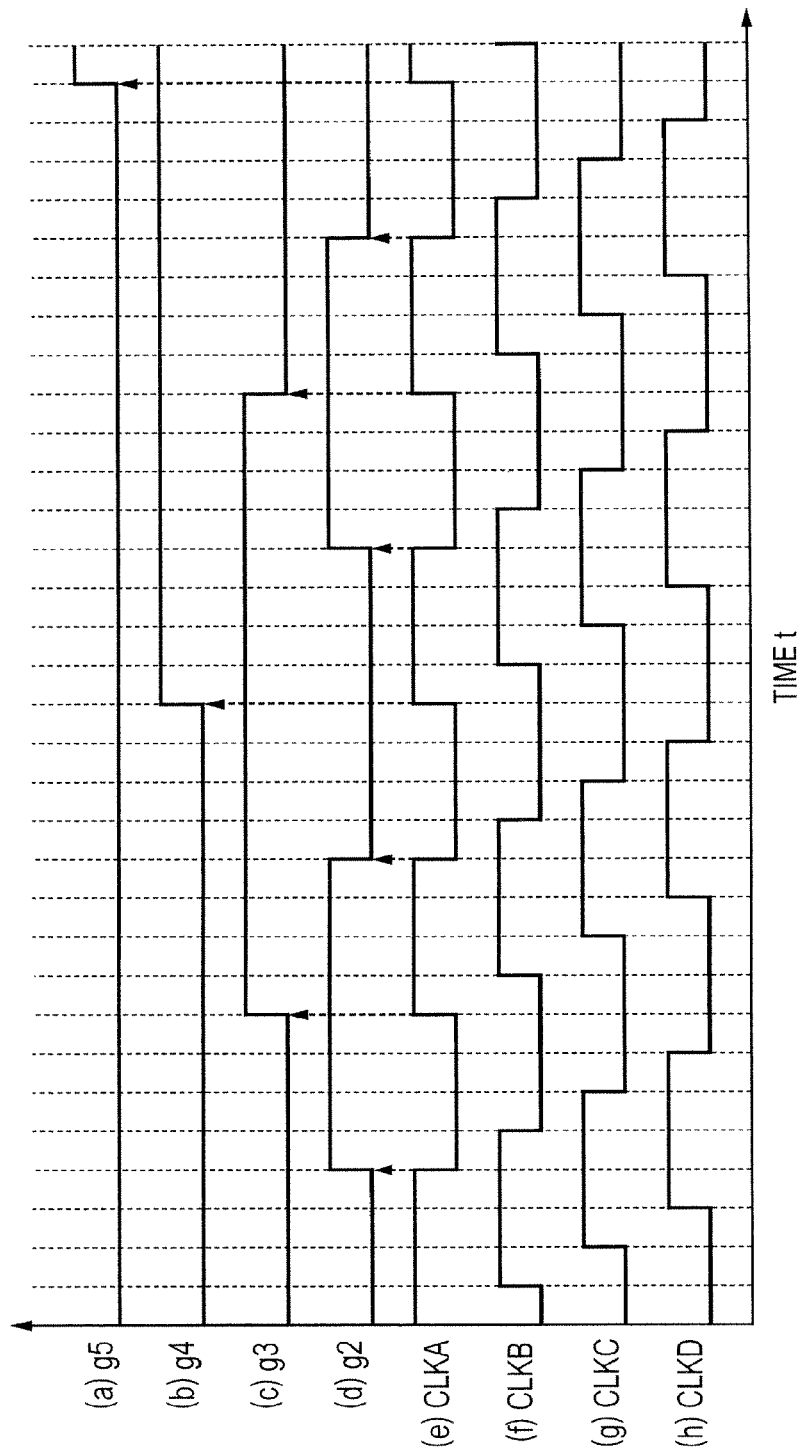
FIG. 18 is a timing chart illustrating operation of the counter illustrated in FIG. 17.

FIG. 18 is a timing chart illustrating operation of the counter 45. As illustrated in FIG. 18, the logical level of gray signal g2 varies with the falling edge of clock signal CLKA. The logical levels of gray signals g3 through g5 vary with the rising edge of clock signal CLKA. The other configurations and operations are equal to those of the first embodiment and a description is omitted for simplicity.

The fourth embodiment provides the same effect as the first embodiment. Further, the fourth embodiment can reduce a phase difference between the low-order bit code made of clock signals CLKB through CLKD and the high-order bit code made of gray signals g2 through g5.

The fourth embodiment supplements the counter according to the first embodiment with the delay circuit 46, the inverter 47, and the synchronization circuits 48 and 49. The delay circuit 46, the inverter 47, and the synchronization circuits 48 and 49 may be added to each of the counters 35 and 40 according to the second and third embodiments.

Fifth Embodiment

Figure 19:
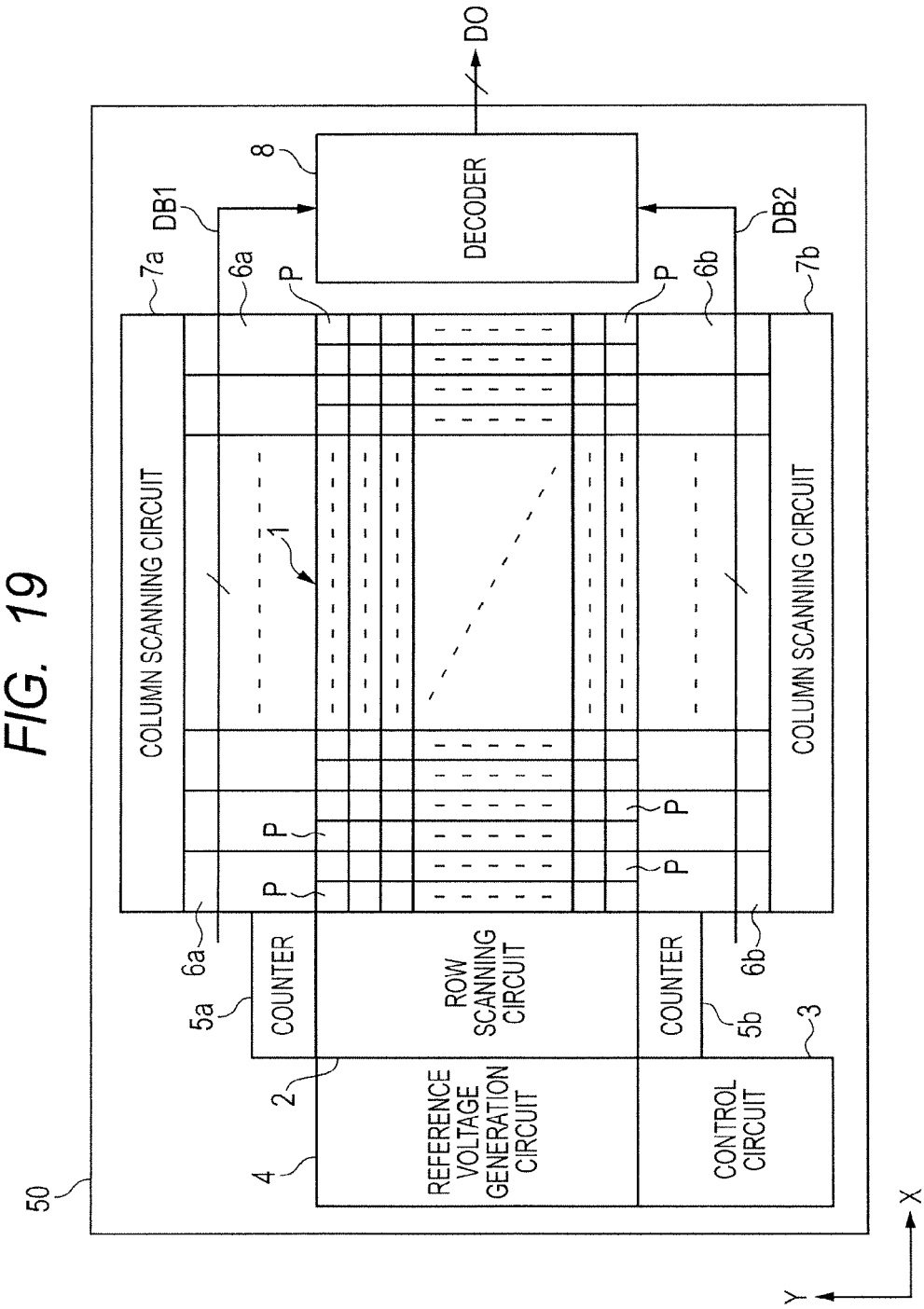
FIG. 19 is a block diagram illustrating a layout of the solid-state imaging apparatus according to a fifth embodiment of the application.

FIG. 19 is a block diagram illustrating a layout of the solid-state imaging apparatus according to the fifth embodiment of the application and is compared with FIG. 1. As illustrated in FIG. 19, the solid-state imaging device includes a rectangular semiconductor substrate 50. The pixel array 1 is formed at the center of the semiconductor substrate 50. The X direction (horizontal direction in FIG. 19) is assumed to extend along the long side of the semiconductor substrate 50. The Y direction (vertical direction in FIG. 19) is assumed to extend along the short side thereof. The pixel array 1 includes multiple pixel circuits P arrayed in a matrix along the X and Y directions. Each pixel circuit P outputs analog voltage VA whose level corresponds to the incident light quantity.

Pixel circuits P are grouped into two columns. Pixel circuit P may be selected from an odd-numbered column as the group and may generate analog voltage VA. In this case, analog voltage VA is output to the upper side of the pixel array 1 in FIG. 19 via signal line SL (not shown). Pixel circuit P may be selected from an even-numbered column as the group and may generate analog voltage VA. In this case, analog voltage VA is output to the lower side of the pixel array 1 in FIG. 19 via signal line SL (not shown).

The row scanning circuit 2 is provided at the left of the pixel array 1 in FIG. 19. A counter 5a is provided over the row scanning circuit 2 in FIG. 19. A counter 5b is provided below the row scanning circuit 2 in FIG. 19. The control circuit 3 and the reference voltage generation circuit 4 are provided adjacent to the row scanning circuit 2.

The control circuit 3 controls the row scanning circuit 2. The row scanning circuit 2 successively selects rows one by one and activates the level of control line CL (not shown) for the selected row. Each pixel circuit P is activated in response to activating the level of corresponding control line CL and outputs, to signal line SL (not shown), analog voltage VA whose level corresponds to the incident light quantity. The control circuit 3 controls the entire solid-state imaging device. The reference voltage generation circuit 4 generates reference voltage VR having ramp waveform whose voltage value varies with the time. The counters 5a and 5b each generate counter code CD whose count value linearly varies with the time at specified cycle T1.

An A/D converter 6a is provided adjacently to the top of each column group in FIG. 19. An A/D converter 6b is provided adjacently to the bottom of each column group in FIG. 19. If analog voltage VA is output from pixel circuit P belonging to an odd-numbered column of the column group, each A/D converter 6a converts that analog voltage VA into a digital signal based on reference voltage VR and counter code CD from the counter 5a. If analog voltage VA is output from pixel circuit P belonging to an even-numbered column of the column group, each A/D converter 6b converts that analog voltage VA into a digital signal based on reference voltage VR and counter code CD from the counter 5b.

A column scanning circuit 7a is provided adjacently to the top of the A/D converters 6a in FIG. 19. A column scanning circuit 7b is provided adjacently to the bottom of the A/D converters 6b in FIG. 19. The column scanning circuit 7a successively selects odd-numbered columns of the pixel array 1 one by one and supplies an output-enabling signal to the integral A/D converter 6a corresponding to the selected odd-numbered column. The column scanning circuit 7b successively selects even-numbered columns of the pixel array 1 one by one and supplies an output-enabling signal to the integral A/D converter 6b corresponding to the selected even-numbered column.

Data bus DB1 is provided to cross the A/D converters 6a. Data bus DB2 is provided to cross the A/D converters 6b. The decoder 8 is provided to the right of the pixel array 1 in FIG. 19. The decoder 8 is coupled to data buses DB1 and DB2. Each integral A/D converter 6a supplies the decoder 8 with a digital signal in response to the output-enabling signal via data bus DB1. Each integral A/D converter 6b supplies the decoder 8 with a digital signal in response to the output-enabling signal via data bus DB2. When digital signals are supplied from the integral A/D converters 6a and 6b via data buses DB1 and DB2, the decoder 8 decodes the digital signals to binary code D0 and outputs it to the outside.

The fifth embodiment provides the same effect as the first embodiment. Further, the fifth embodiment can easily satisfy demands for increasing an area of the pixel array 1, miniaturizing the pixel circuit P, and accelerating a read speed.

While there have been described specific preferred embodiments of the present invention created by the inventors, it is to be distinctly understood that the present invention is not limited thereto but may be otherwise variously embodied within the spirit and scope of the invention.

What is claimed is:

1. A solid-state imaging apparatus comprising:
   a pixel circuit to output an analog voltage having a level corresponding to an incident light quantity;
   a reference voltage generation circuit to generate a reference voltage which has a ramp waveform;
   a counter to generate a counter code by counting a main clock signal; and
   an integral A/D converter to convert the analog voltage into a digital signal,
   wherein the integral A/D converter includes:
      a comparator to compare the reference voltage with the analog voltage; and
      a latch circuit to latch the counter code based on a comparison result from the comparator when high-low relationship between the reference voltage and the analog voltage reverses, and
   wherein the counter includes:
      a Johnson counter to generate first to Mth clock signals corresponding to the main clock signal, the first to Mth clock signals each have a cycle equal to a cycle of the main clock signal multiplied by 2×M and a phase to shift from each other by the cycle of the main clock signal;
   a binary counter to generate a binary code by counting the first clock signal; and
   a binary/gray converter to convert the binary code into the gray code,
   wherein the second through Mth clock signals configure a low-order bit code of the counter code, and
   wherein the gray code configure a high-order bit code of the counter code.

2. The solid-state imaging apparatus according to claim 1, wherein the counter further includes:
   a delay circuit to delay the first through Mth clock signals by predetermined time; and
   a synchronization circuit to synchronize the gray code with the first clock signal delayed by the delay circuit.

3. A solid-state imaging apparatus comprising:
   a pixel circuit to output an analog voltage having a level corresponding to an incident light quantity;
   a reference voltage generation circuit to generate a reference voltage which is a ramp waveform;
   a counter to generate a counter code by counting a main clock signal; and
   an integral A/D converter to convert the analog voltage into a digital signal,
   wherein the integral A/D converter includes:
      a comparator to compare the reference voltage with the analog voltage; and
      a latch circuit to latch the counter code based on a comparison result from the comparator when high-low relationship between the reference voltage and the analog voltage reverses, and
   wherein the counter includes:
      a Johnson counter to generate first to Mth clock signals corresponding to the main clock signal, the first to Mth clock signals each have a cycle equal to a cycle of the main clock signal multiplied by 2×M and a phase to shift from each other by the cycle of the main clock signal;
   a binary counter to generate a binary code by counting the main clock signal; and
   a binary/gray converter to convert the binary code into the gray code,
   wherein the second through Mth clock signals configure a low-order bit code of the counter code, and
   wherein a part of the gray code configure a high-order bit code of the counter code.

4. The solid-state imaging apparatus according to claim 3, wherein the counter further includes:
   a delay circuit to delay the first through Mth clock signals by predetermined time; and
   a synchronization circuit to synchronize the part of the gray code with the first clock signal delayed by the delay circuit.

* * * * *